United States Patent
Cadloni et al.

(10) Patent No.: US 11,188,416 B2
(45) Date of Patent: Nov. 30, 2021

(54) ENHANCED BLOCK MANAGEMENT FOR A MEMORY SUB-SYSTEM

(71) Applicant: Micron Technology, Inc., Boise, ID (US)

(72) Inventors: Gerald L. Cadloni, Longmont, CO (US); Bruce A. Liikanen, Berthoud, CO (US)

(73) Assignee: Micron Technology, Inc., Boise, ID (US)

( * ) Notice: Subject to any disclaimer, the term of this patent is extended or adjusted under 35 U.S.C. 154(b) by 148 days.

(21) Appl. No.: 16/034,110

(22) Filed: Jul. 12, 2018

(65) Prior Publication Data
US 2020/0019459 A1 Jan. 16, 2020

(51) Int. Cl.
| | |
|---|---|
| G06F 11/00 | (2006.01) |
| G06F 11/10 | (2006.01) |
| G11C 29/52 | (2006.01) |
| G06F 11/14 | (2006.01) |
| G06F 3/06 | (2006.01) |

(52) U.S. Cl.
CPC ........ *G06F 11/1068* (2013.01); *G06F 3/0619* (2013.01); *G06F 3/0653* (2013.01); *G06F 3/0673* (2013.01); *G06F 11/142* (2013.01); *G11C 29/52* (2013.01); *G06F 2201/82* (2013.01)

(58) Field of Classification Search
CPC .. G06F 11/1068; G06F 3/0619; G06F 3/0653; G06F 3/0673; G11C 29/52
See application file for complete search history.

(56) References Cited

U.S. PATENT DOCUMENTS

| | | |
|---|---|---|
| 9,092,350 B1 | 7/2015 | Jeon et al. |
| 9,153,336 B1 | 10/2015 | Yang et al. |
| 9,355,735 B1 | 5/2016 | Chen et al. |
| 9,454,420 B1 | 9/2016 | Tai et al. |
| 9,558,850 B1 | 1/2017 | Bialas et al. |
| 9,761,308 B1 | 9/2017 | Cometti |

(Continued)

FOREIGN PATENT DOCUMENTS

GB  2383455 A  6/2003

OTHER PUBLICATIONS

International Application No. PCT/US2018/033873—International Search Report & Written Opinion, dated Sep. 7, 2018, 9 pages.

(Continued)

*Primary Examiner* — Philip Guyton
(74) *Attorney, Agent, or Firm* — Perkins Coie LLP (57) ABSTRACT

Several embodiments of systems incorporating memory components are disclosed herein. In one embodiment, a memory system can include a memory component and a processing device configured to access quality metrics corresponding to memory regions of the memory component. In some embodiments, the processing device can compare the quality metrics to one or more memory management thresholds. In some embodiments, when the quality metrics meet and/or exceed a first threshold, a refresh operation can be scheduled and/or performed on a corresponding memory region. In these and other embodiments, when the quality metrics meet and/or exceed a second threshold, the memory region is retired and removed from an active pool of memory regions.

20 Claims, 5 Drawing Sheets

(56) References Cited

U.S. PATENT DOCUMENTS

| | | |
|---|---|---|
| 10,140,040 B1 | 11/2018 | Koudele et al. |
| 10,170,195 B1 | 1/2019 | Ioannou et al. |
| 10,379,739 B1 | 8/2019 | Bazarsky et al. |
| 10,388,376 B2 | 8/2019 | Molas et al. |
| 2002/0152459 A1 | 10/2002 | Bates et al. |
| 2005/0201148 A1 | 9/2005 | Chen et al. |
| 2006/0277429 A1 | 12/2006 | Dasari et al. |
| 2007/0025167 A1 | 2/2007 | Ziegelmayer et al. |
| 2009/0055680 A1 | 2/2009 | Honda et al. |
| 2010/0073069 A1 | 3/2010 | Wang et al. |
| 2010/0097857 A1 | 4/2010 | Cernea |
| 2010/0188919 A1 | 7/2010 | Fox et al. |
| 2011/0119431 A1* | 5/2011 | Chowdhury ............ G11C 29/42 711/103 |
| 2011/0167307 A1 | 7/2011 | Mori |
| 2011/0305090 A1 | 12/2011 | Roohparvar et al. |
| 2012/0030531 A1 | 2/2012 | Brewerton et al. |
| 2012/0213001 A1 | 8/2012 | Yang |
| 2012/0236653 A1 | 9/2012 | Spessot et al. |
| 2012/0254699 A1 | 10/2012 | Ruby et al. |
| 2013/0007543 A1 | 1/2013 | Goss et al. |
| 2013/0024743 A1 | 1/2013 | Sharon et al. |
| 2013/0117604 A1 | 5/2013 | Ha |
| 2013/0132652 A1 | 5/2013 | Wood et al. |
| 2013/0227200 A1 | 8/2013 | Cometti et al. |
| 2013/0346805 A1 | 12/2013 | Sprouse et al. |
| 2014/0136928 A1 | 5/2014 | Mu et al. |
| 2014/0157065 A1 | 6/2014 | Ong |
| 2014/0281661 A1 | 9/2014 | Milton et al. |
| 2014/0281767 A1 | 9/2014 | Alhussien et al. |
| 2015/0036432 A1 | 2/2015 | Huang |
| 2015/0085573 A1 | 3/2015 | Sharon et al. |
| 2015/0154064 A1 | 6/2015 | Ghaly et al. |
| 2015/0309858 A1 | 10/2015 | Weilemann et al. |
| 2015/0378415 A1 | 12/2015 | George |
| 2016/0041891 A1 | 2/2016 | Malshe et al. |
| 2016/0092496 A1 | 3/2016 | Dietterich et al. |
| 2016/0117216 A1 | 4/2016 | Muchherla et al. |
| 2016/0132256 A1 | 5/2016 | Jung |
| 2016/0133334 A1 | 5/2016 | Zhang et al. |
| 2016/0147582 A1 | 5/2016 | Karakulak et al. |
| 2016/0148701 A1 | 5/2016 | Karakulak et al. |
| 2016/0148702 A1 | 5/2016 | Karakulak et al. |
| 2016/0148708 A1 | 5/2016 | Tuers et al. |
| 2016/0162185 A1 | 6/2016 | D'Abreu et al. |
| 2016/0179406 A1 | 6/2016 | Gorobets et al. |
| 2016/0218740 A1 | 7/2016 | Parthasarathy et al. |
| 2016/0259693 A1 | 9/2016 | Sundararaman et al. |
| 2016/0266792 A1 | 9/2016 | Amaki et al. |
| 2017/0053714 A1 | 2/2017 | Guy et al. |
| 2017/0091039 A1 | 3/2017 | Hong |
| 2017/0097868 A1 | 4/2017 | Kim et al. |
| 2017/0126255 A1* | 5/2017 | Colgrove ............ H03M 13/353 |
| 2017/0148510 A1 | 5/2017 | Bazarsky et al. |
| 2017/0241843 A1 | 8/2017 | Jeon et al. |
| 2017/0263311 A1 | 9/2017 | Cometti |
| 2017/0269991 A1 | 9/2017 | Bazarsky et al. |
| 2017/0271031 A1 | 9/2017 | Sharon et al. |
| 2018/0189125 A1 | 7/2018 | Karlik et al. |
| 2018/0277228 A1 | 9/2018 | Takada et al. |
| 2018/0341416 A1 | 11/2018 | Koudele et al. |
| 2018/0341552 A1 | 11/2018 | Liikanen et al. |
| 2018/0341553 A1 | 11/2018 | Koudele et al. |
| 2019/0103164 A1 | 4/2019 | Malshe et al. |
| 2019/0147964 A1 | 5/2019 | Yun et al. |
| 2019/0164599 A1 | 5/2019 | Avraham et al. |
| 2019/0171381 A1 | 6/2019 | Ioannou et al. |
| 2019/0172542 A1 | 6/2019 | Miladinovic |
| 2019/0278653 A1* | 9/2019 | Padilla, Jr. ............. G11C 29/52 |
| 2019/0354312 A1 | 11/2019 | Chew et al. |
| 2019/0354313 A1 | 11/2019 | Sheperek et al. |
| 2020/0019453 A1 | 1/2020 | Chew et al. |
| 2020/0117387 A1 | 4/2020 | Cadloni et al. |

OTHER PUBLICATIONS

International Application No. PCT/US2018/033877—International Search Report & Written Opinion, dated Sep. 14, 2018, 22 pages.
International Application No. PCT/US2018/033881—International Search Report & Written Opinion, dated Sep. 14, 2018, 12 pages.
International Application No. PCT/US2019/033179—International Search Report and Written Opinion, dated Sep. 18, 2019, 12 pages.
TW Patent Application No. 107117756—Taiwanese Office Action and Search Report, dated Jan. 31, 2019, 19 pages.
TW Patent Application No. 107117756—Taiwanese Search Report, dated Jul. 22, 2019, with English Translation, 2 pages.
TW Patent Application No. 107117813—Taiwanese Office Action and Search Report, dated Mar. 18, 2019, 17 pages.

* cited by examiner

Fig. 1

| Error Recovery Step | Error Recovery Name | Description | RR Description (Vt Offset Clicks) | Energy | Zone |
|---|---|---|---|---|---|
| 1 | RR0 | Read Retry 0 + Hard LDPC | RR0 = default (0) | 1 | 1 |
| 2 | RR1 | Read Retry 1 + Hard LDPC | RR1 = endurance (+2) | 1 | 1 |
| 3 | RR2 | Read Retry 2 + Hard LDPC | RR2 = retention (-2) | 1 | 1 |
| 4 | RR3 | Read Retry 3 + Hard LDPC | RR3 = endurance (+5) | 1 | 1 |
| 5 | RR4 | Read Retry 4 + Hard LDPC | RR4 = retention (-6) | 1 | 1 |
| 6 | RR5 | Read Retry 5 + Hard LDPC | RR5 = endurance (+9) | 1 | 1 |
| 7 | RR6 | Read Retry 6 + Hard LDPC | RR6 = retention (-12) | 1 | 1 |
| 8 | RR7 | Read Retry 7 + Hard LDPC | RR7 = endurance (+14) | 1 | 1 |
| 9 | RR8 | Read Retry 8 + Hard LDPC | RR8 = (RR0 + Corrective Read) | 3 | 2 |
| 10 | Soft | Read Retry 0 + Soft LDPC | RR0 + Soft LDPC | 5 | 2 |
| 11 | AutoCal + pers1 | Read Retry 0 + Auto Calibration (P1=0x03) | RR0 + Auto Calibration with persistence 1 | 6 | 2 |
| 12 | AutoCal + pers2 | Read Retry 0 + Auto Calibration (P1=0x03) | RR0 + Auto Calibration with persistence 2 | 6 | 2 |
| 13 | AutoCal + pers3 | Read Retry 0 + Auto Calibration (P1=0x03) | RR0 + Auto Calibration with persistence 3 | 6 | 2 |
| 14 | AutoCal + pers4 | Read Retry 0 + Auto Calibration (P1=0x03) | RR0 + Auto Calibration with persistence 4 | 6 | 3 |
| 15 | RR8 + pers4 | Read Retry 8 + Auto Calibration (P1=0x02) | RR8 = (RR0 + Corrective Read) with persistence 4 | 3 | 3 |
| 16 | RR0 + pers4 + Soft | Read Retry 0 + Auto Calibration (P1=0x02) + Soft LDPC | RR0 + Soft LDPC with persistence 4 | 5 | 3 |
| 17 | RAID | Read Retry 0 + RAID | RR0 + RAID | 500 | 4 |

ENHANCED BLOCK MANAGEMENT FOR A MEMORY SUB-SYSTEM

TECHNICAL FIELD

The present disclosure is related to memory sub-systems. In particular, the present disclosure is related to enhanced block management for a memory sub-system.

BACKGROUND

When data is stored in nonvolatile memory, it is important to have a mechanism that can detect and correct a certain number of errors in the stored data. Error correction code (ECC) encodes data in such a way that errors in the data can be identified and corrected when the data is decoded. For example, data strings can be encoded by an ECC encoder by adding a number of redundant and/or parity bits to create corresponding codewords. When an original data string is to be retrieved from the memory, an ECC decoder can use the corresponding codewords to identify bit errors in the encoded data string. If bit errors are present, one or more ECC operations can be employed to correct the bit errors and to recover the original data string.

In addition to outputting error-checked and/or error-corrected data, some implementations of the ECC can also generate metadata regarding an ECC decode operation. For example, ECC operations can generate a bit error count (e.g., the number of bit errors identified and/or corrected) corresponding to a decoded codeword. ECC operations can also generate an indication of whether bit errors can be successfully corrected. Because the metadata can provide an indication of the health or quality of memory regions storing each codeword, the metadata is frequently referred to as quality metrics of the memory regions.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

As discussed in greater detail below, the technology disclosed herein relates to nonvolatile memory systems and devices configured to use quality metrics for enhanced block management. A person skilled in the art, however, will understand that the technology may have additional embodiments and that the technology may be practiced without several of the details of the embodiments described below with reference to FIGS. 1-5. In the illustrated embodiments below, the memory devices are primarily described in the context of devices incorporating NAND-based storage media (e.g., NAND flash). Memory devices configured in accordance with other embodiments of the present technology, however, can include other types of memory devices (e.g., 3D-NAND, phase change memory, ferroelectric, etc.) and/or can include main memories that are not NAND-based (e.g., NOR-based) or only partially NAND-based.

In a memory device having a large population of NAND-based storage media, there are often a limited set of memory regions (e.g., memory blocks) that are eliminated throughout the life of the memory device. In conventional memory devices, for example, a memory region is retired (e.g., removed from a pool of active memory regions that store data) when a codeword saved on the memory region enters a redundant array of independent disks/drives (RAID) error recovery state and/or when a codeword is classified as an uncorrectable ECC (UECC) error, such that original data corresponding to the codeword is irrecoverable. Each of these events (e.g., a RAID event and a UECC event) can signify that the impacted memory region was significantly out of calibration and/or suffering from one or more physical defects before it was retired. In other words, conventional memory devices may wait until a memory region is at an elevated risk of irrecoverably losing data stored on the memory region before interceding and retiring the memory region. Thus, until memory regions enter a RAID and/or a UECC state, the memory regions are often repeatedly handled by an error recovery routine of the memory device.

As discussed in greater detail below, by configuring a memory device to execute error recovery operations in a particular order, information about which error recovery operations from that order was able to successfully correct bit errors in a codeword can provide an indication of the health and/or quality of a memory region corresponding to where the codeword was saved. For example, by configuring a memory device to first perform a set of one or more error recovery operations that can correct a majority of bit errors that occur as a result of normal and/or expected operation of the memory device, execution of an error recovery operation outside of this set on a codeword can indicate that a memory region storing the codeword may be out of calibration and/or include one or more defects. This information can (i) provide an early indication of the less capable, potentially defective, and/or poor performing memory regions in the memory device before the memory regions enter a RAID and/or a UECC state.

Using this information (e.g., which can be analyzed in or near real-time, or stored for later analysis), memory devices configured in accordance with the present technology can proactively discover, refresh (e.g., correct), and/or retire the less capable, potentially defective, and/or poor performing memory regions before they become an error recovery problem and/or without risking irrecoverably losing data stored in those memory regions. For example, a memory device can classify error recovery operations into one or more error recovery operation zones. In some embodiments, the memory device can be configured to refresh and/or retire a memory region based, at least in part, on whether the memory device executed one or more error recovery operation(s) from particular error recovery operation zones on one or more codewords saved in the memory region. In these and other embodiments, the memory device can be configured to refresh and/or retire a memory region based, at least in part, on whether the memory device executed a predetermined number of error recovery operations (e.g., from a particular error recovery operation zone) on one or more codewords saved in the memory region. In these and still other embodiments, the memory device can be configured to refresh and/or retire a memory region based, at least in part, on the memory device determining a certain number of times that one or more codewords saved in the memory region (i) have bit error counts exceeding a codeword BEC threshold in comparison to a codeword BEC event threshold and/or (ii) are classified as unreliable and/or as uncorrectable (e.g., UECC) in comparison to a UECC event threshold. In this manner, rather than repeatedly handling a defective and/or problematic memory region with an error recovery routine of the memory device and/or waiting for a memory region to enter a RAID and/or a UECC state before retiring the region, memory devices configured in accordance with embodiments of the present technology can accelerate the discovery, refreshment, and/or retirement of defective and/or problematic memory regions (e.g., using lower error recovery thresholds) while bit errors in a codeword are correctable and original data corresponding to the codeword is not at an elevated risk of becoming irrecoverable. Thus, memory devices configured in accordance with the present technology are expected to reduce data storage reliability issues.

Figure 1:
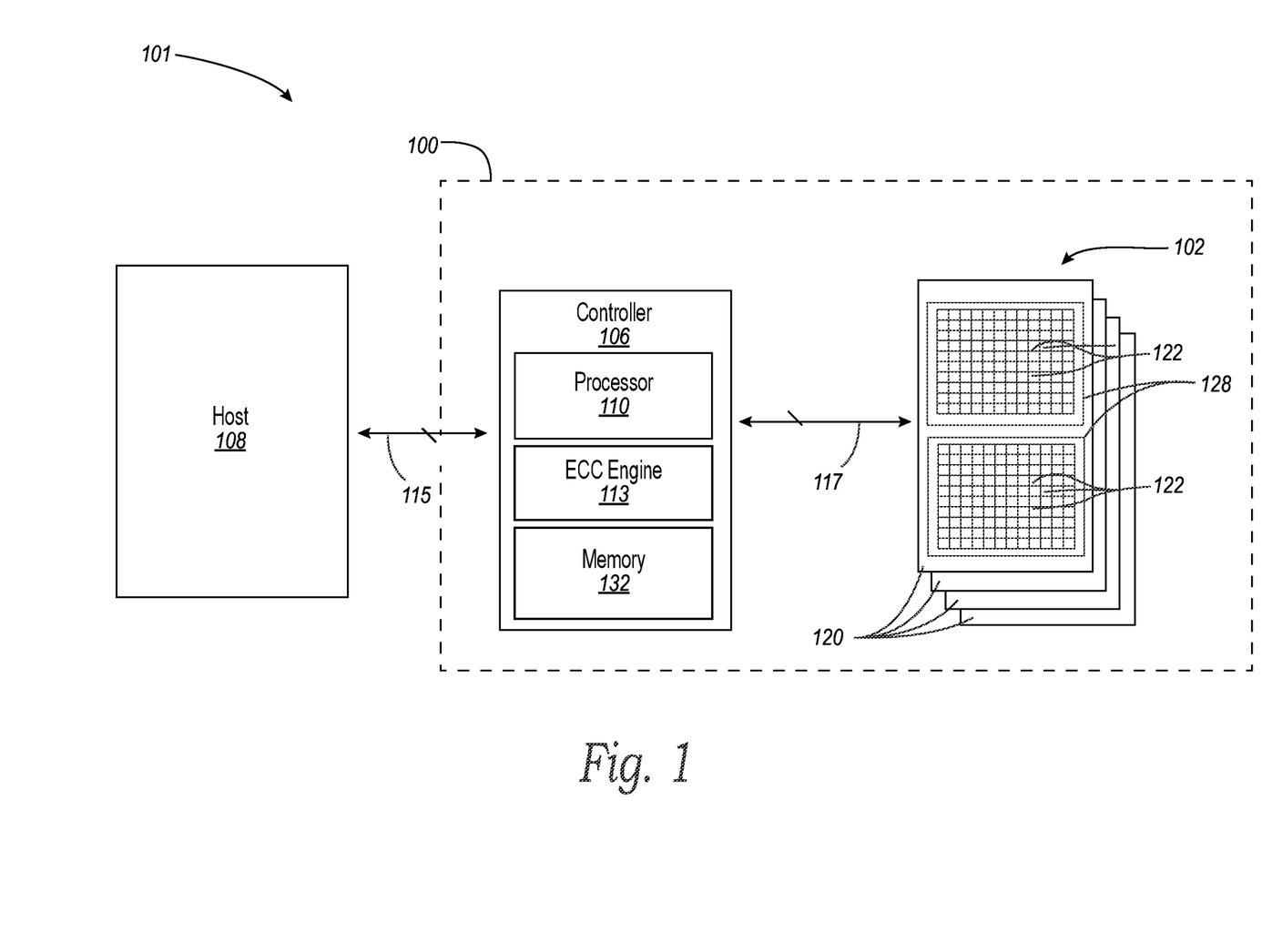
FIG. 1 is a block diagram of a system having a memory device configured in accordance with embodiments of the present technology.

FIG. 1 is a block diagram of a system 101 having a memory sub-system (also hereinafter referred to as a "memory device" (e.g., memory device 100)) configured in accordance with an embodiment of the present technology. An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system. As shown, the memory device 100 includes one or more memory components (e.g., memory component 102) and a controller 106 (e.g., a processing device) operably coupling the memory component 102 to a host device 108 (e.g., an upstream central processor (CPU)). The memory component 102 includes a plurality of memory regions, or memory units 120, which include a plurality of memory cells 122. Memory units 120 can be individual memory dies, memory planes in a single memory die, a stack of memory dies vertically connected with through-silicon vias (TSVs), or the like. In one embodiment, each of the memory units 120 can be formed from a semiconductor die and arranged with other memory unit dies in a single device package (not shown). In other embodiments, one or more of the memory units 120 can be co-located on a single die and/or distributed across multiple device packages. The memory cells 122 can include, for example, NAND flash and/or other suitable storage elements (e.g., NOR flash, read only memory (ROM), electrically erasable programmable ROM EEPROM, erasable programmable ROM (EPROM), ferroelectric, magnetoresistive, phase change memory, etc.) configured to store data persistently or semi-persistently. The memory component 102 and/or the individual memory units 120 can also include other circuit components (not shown) (e.g., memory subsystems), such as multiplexers, decoders, buffers, read/write drivers, address registers, data out/data in registers, etc., for accessing and/or programming (e.g., writing) the memory cells 122 and other functionality, such as for processing information and/or communicating with the controller 106 via a device bus 117.

The controller 106 can be a microcontroller, special purpose logic circuitry (e.g., a field programmable gate array (FPGA), an application specific integrated circuit (ASIC), etc.), or other suitable processor. The controller 106 can include a processor 110 configured to execute instructions stored in memory, such as ECC operations. The processor 110 can be a processing device. In the illustrated example, the controller 106 includes an embedded memory 132 configured to store various processes, logic flows, and routines for controlling operation of the memory device 100, including managing the memory component 102 and handling communications between the memory device 100 and the host device 108. In some embodiments, the embedded memory 132 can include memory registers storing, e.g., memory pointers, fetched data, etc. The embedded memory 132 can also include read-only memory (ROM) for storing micro-code. In operation, the controller 106 can directly read, write, or otherwise program (e.g., erase) the various memory regions of the memory component 102, such as by reading from and/or writing to groups of memory cells 122 (e.g., memory pages, stripes of memory pages, memory blocks 128, etc.).

The controller 106 communicates with the host device 108 over a system bus 115. In some embodiments, the host device 108 and the controller 106 can communicate over a serial interface, such as a serial attached SCSI (SAS), a serial AT attachment (SATA) interface, a peripheral component interconnect express (PCIe), or other suitable interface (e.g., a parallel interface). The host device 108 can send various requests (in the form of, e.g., a packet or stream of packets) to the controller 106. A request can include a command to write, erase, return information, and/or to perform a particular operation (e.g., a TRIM operation). In some embodiments, the host device 108 can send various vendor specific (VS) commands to perform one or more restricted operations (e.g., access a restricted region of the memory component 102, enter a debugging mode, reset restricted data, etc.).

The memory device 100 can further include ECC hardware, such as an ECC engine 113, configured to encode and/or decode data stored in the memory component 102. In the illustrated embodiment, the ECC engine 113 is located on the controller 106. In other embodiments, the ECC engine 113 can be located on the memory component 102 and/or various components of the ECC engine 113 can be spread over the memory component 102 and the controller 106. In some embodiments, the ECC engine 113 can be a Bose-Chaudhuri-Hocquenghem (BCH) ECC engine and/or a low-density parity check (LDPC) ECC engine. In these and other embodiments, the ECC engine 113 can be a Reed-Solomon (RS) ECC engine, a tightly-coupled memory (TCM) ECC engine, and/or another type of ECC engine. In these and still other embodiments, the memory device 100 can include more than one ECC engine 113. In some embodiments, the ECC engine 113 can include an ECC encoder (not shown) and/or an ECC decoder (not shown).

The ECC engine 113 (e.g., the encoder and/or the ECC decoder) are configured to encode and decode, respectively, data stored in the memory component 102 of the memory device 100 (e.g., to detect and/or correct errors in data read out from, written to, and/or stored in the memory component 102). More specifically, the ECC engine 113 is configured to encode data in accordance with one or more ECC approaches (e.g., block codes, convolution codes, and others) to create codewords. For example, the ECC engine 113 can encode a data string by adding a number of redundant and/or parity bits to the data string. In a specific example, the ECC engine 113 can encode a data string with k number of bits into a block with n number of bits having k-n parity bits in accordance with a block ECC. Blocks with parity bits in this example are called codewords. Codewords created by the ECC engine 113 are written to memory regions in the memory device (e.g., the memory component 102). In some embodiments, each memory page in the memory component 102 of the memory device 100 is configured to store four codewords. In other embodiments, each memory page is configured to store 16 codewords. In still other embodiments, the number of codewords a memory page is configured to store can vary. For example, memory pages in other embodiments can be configured to store a greater (e.g., 17 or more) or lesser (e.g., 15 or less and/or three or less) number of the codewords per memory page.

When one or more codewords are read out from the memory component 102 (e.g., during an access and/or a scan operation of the memory device 100), the ECC engine 113 (e.g., the ECC decoder) decodes each codeword to reconstruct the original data string(s). In some embodiments, the controller 106 can scan the memory component 102 (e.g., by die, by block, by memory page, by stripes of memory pages, etc.) to ensure data stored on the memory component 102 and/or on the embedded memory 132 has not and/or will not become corrupted (e.g., as part of a manufacturing and/or end-user error avoidance operation of the memory device 100). The scan function can be similar to an accessing function of the memory device 100 in that one or more codewords are read from the memory component 102. Thus, the ECC engine 113 is used to decode each codeword read into the controller 106 under an access operation and a scan operation of the memory device 100. The scan operation differs from the access operation, however, in that original data strings reconstructed from the codewords are not typically output to the host device 108.

The ECC engine 113 uses the codewords (e.g., the parity bits) of each data string to provide an indication of whether there are bit errors in the data string. A bit error, or bit flip, occurs if a bit is read in a first logic state (e.g., "0") when the bit was intended to be in a second logic state (e.g., "1"). Similarly, a bit error occurs if a bit is read in the second logic state when the bit was intended to be in the first logic state. Common reasons for bit errors include writing the data string to memory at elevated temperatures and/or reading the data strings from memory in the presence of a large amount of noise. Other reasons for bit errors include defects in the memory cells 122 storing the bits of data. As described in greater detail below, if the ECC engine 113 determines that one or more bit errors are present, the ECC engine 113 can employ one or more error recovery operations to correct the bit errors and to recover the original data string.

During an ECC decode operation, the ECC engine 113 can also generate metadata regarding codewords and/or memory regions (e.g., memory dies, memory units 120, memory blocks 128, memory pages, stripes of memory pages, memory cells 122, etc.) of the memory component 102 where the codewords are saved. For example, the ECC engine 113 can generate metadata including (i) a location (e.g., a memory region) in memory where a codeword is stored; (ii) whether errors are detected in the codeword, (iii) the number of bit errors present in the codeword (i.e., the number of bit errors that need to be corrected in order to clear a codeword and to recover an original data string, or a bit error count (BEC)); and/or (iv) whether bit errors have been encountered in the corresponding memory region in the past. As discussed above, if the ECC engine 113 determines there are bit errors in a codeword, the ECC engine 113 can employ one or more error recovery operations to correct the bit errors and to recover the original data string. As a result, the ECC engine 113 can generate additional metadata, such as (i) error recovery operations used to recover the original data string; (ii) how much energy was consumed by the error recovery operations; (iii) an amount of time (e.g., processing time) required to recover the original data string; (iv) whether the codeword contained uncorrectable bit errors (e.g., a UECC event); and/or (v) whether a memory region corresponding to a memory location where the codeword was stored required a refresh and/or retirement operation. Because the metadata can provide an indication of the health or quality of memory regions storing each codeword, the metadata is frequently referred to as quality metrics of the memory regions.

In some embodiments, quality metrics can be saved to the memory device 100 (e.g., in the memory component 102, in the embedded memory 132, etc.). For example, a memory location (e.g., a memory channel, memory die, logical unit, physical block, physical page, and/or codeword location in the physical page) corresponding to where a codeword is stored can be saved in one or more logs. In these and other embodiments, an error recovery operation used to successfully correct the bit error(s) and/or a number of times bit errors have been encountered in the corresponding memory region in the past can be stored in the one or more logs. In these and still other embodiments, a type of operation, such as a refresh operation (e.g., a garbage collection operation) and/or a retirement operation, executed on the corresponding memory region can be saved in the one or more logs. In some embodiments, the memory device 100 can be configured to save one or more quality metrics to the one or more logs in response to an event (e.g., a trigger event), such as when a codeword is uncorrectable, when a codeword enters a RAID state, when a bit error count (BEC) of a codeword is above a codeword BEC threshold. In these and other embodiments, one or more of the quality metrics can be saved to the log(s) in response to the memory device 100 executing particular error recovery operations, as discussed in greater detail below.

In some embodiments, the quality metrics can be used by the controller for ECC validation and/or debugging operations. In these and other embodiments, quality metrics can be used by the controller 106, other components of the memory device 100, and/or the host device 108 in several other operations of the memory device 100. For example, continuous read level calibration (cRLC), dynamic program target (DPT) calibration, dynamic program step (DPS) calibration, and the like are error avoidance ECC operations that utilize quality metrics during the manufacture or operation of the memory device 100 to calibrate memory regions (e.g., memory cells 122, memory pages, memory blocks 128, memory die 120, etc.) thereof. Additionally or alternatively, several error avoidance ECC operations of an end-user memory device 100 can utilize quality metrics to operate more efficiently and/or effectively. For example, background scan, DPT for read window budge (RWB) measurements and improvements, and power loss recovery procedures each use quality metrics of the codewords as error avoidance ECC operations within an end-user memory device 100. In these and other embodiments, the memory device 100 can make memory (e.g., memory block 128) management decisions based, at least in part, on quality metrics generated and/or saved during an ECC decode operation, as discussed in greater detail below.

Figure 2:
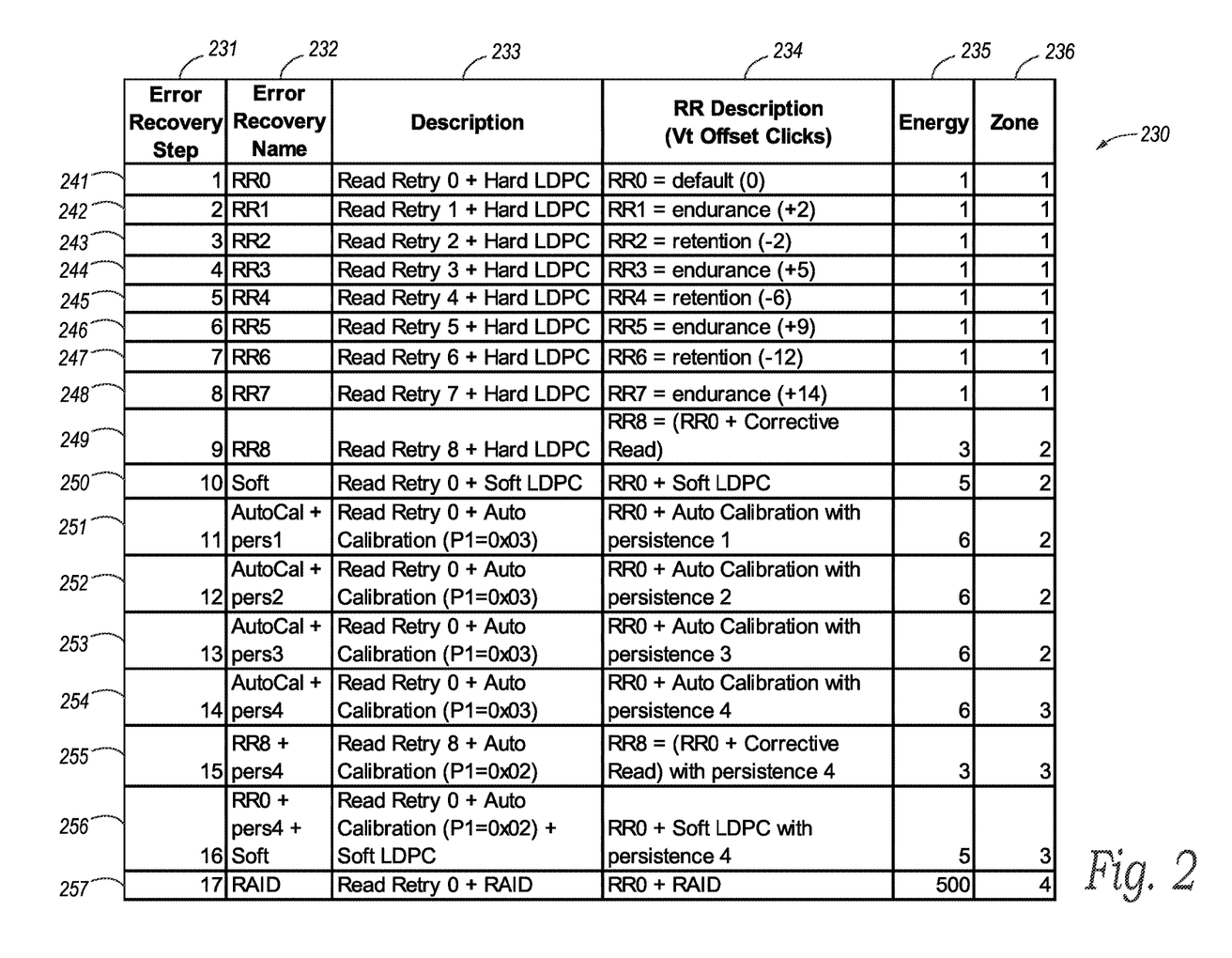
FIG. 2 is a table illustrating an error recovery error correction code (ECC) schedule of a memory device configured in accordance with embodiments of the present technology.

FIG. 2 is a table illustrating an error recovery schedule 230 that can be employed by the memory device 100 when the memory device 100 discovers one or more bit errors in a codeword. As shown in FIG. 2, the schedule 230 includes 17 error recovery operations listed in rows 241-257 of columns 232-234 in the schedule 230. These error recovery operations include combinations of (i) read retries without an offset (in rows 241 and 249-257), (ii) read retries with various sizes of offsets (the rows 242-248), (iii) hard low-density parity checks (in rows 241-249, 251-255, and/or 257), (iv) soft low-density parity checks (in rows 250 and 256), (v) corrective reads (in rows 249 and 255), (vi) auto calibrations with various levels of persistence (in rows 251-256), and/or (vii) redundant array of independent disks/drives (RAID) recovery operations (in row 257). Although each of the error recovery operations listed in the schedule 230 includes a combination of one or more of the ECC operations listed above, error recovery operations in other embodiments can include a single ECC operation. In these and other embodiments, the memory device 100 (e.g., the ECC engine 113) can be configured to execute different error recovery operations (e.g., error recovery operations with different read offsets, redundant array of independent NAND (RAIN) recovery operations, etc.) in addition to or in lieu of those listed in the schedule 230 and/or can be configured to execute a greater or fewer number of error recovery operations (e.g., before executing RAID error recovery operations) than listed in the schedule 230.

The column 235 of the schedule 230 lists an energy score for each error recovery operation. An energy score can correspond to an amount of energy consumed by an error recovery operation. For example, the error recovery operations listed in the rows 241-248 have an energy score of one (column 235). In some embodiments, an energy score of one means that the memory device 100 requires a small amount of energy to execute a corresponding error recovery operation. In contrast, the RAID error recovery operation listed in the row 257 of the schedule 230 has an energy score of 500. In some embodiments, an energy score of 500 means that the memory device 100 requires approximately 500 times the amount of energy to execute a corresponding error recovery operation than the memory device 100 requires to execute an error recovery operation with an energy score of one.

In some embodiments, the schedule 230 can define a particular order in which the memory device 100 executes the error recovery operations. For example, the schedule 230 can order the error recovery operations in accordance with their energy score. In these and other embodiments, the schedule 230 can order the error recovery operations in accordance with an amount of time (e.g., processing time) the memory device 100 requires to fully execute each error recovery operation and/or in accordance with a likelihood (e.g., a likelihood of success) that an error recovery operation will correct the bit error(s) and clear a codeword. In these and still other embodiments, the schedule 230 can order the error recovery operations such that the memory device 100 executes reread operations on each side of (e.g., sweeping across) a read threshold of a memory region storing the codeword (e.g., to check for both endurance and retention issues).

In some embodiments, the order of error recovery operations can be predetermined and/or preset (e.g., during manufacture of the memory device 100). In these and other embodiments, the order of error recovery operations can be established in an end-user memory device 100 (e.g., using a VS command). In these and still other embodiments, the order can be changed and/or can be dynamic. For example, the memory device 100 can change the order in which the memory device 100 executes the error recovery operations in response to a command (e.g., a VS command). In these and other embodiments, the order can be reestablished based, at least in part, on quality metrics generated by the ECC engine 113, on a type of defect discovered in a corresponding memory region, and/or on other information.

In the illustrated embodiment, the memory device 100 is configured to sequentially perform the error recovery operations in the order they are listed in the schedule 230 (as shown by column 231 of the schedule 230). In this embodiment, the error recovery operations are ordered according to a combination of factors (e.g., a cost function), including their energy scores (e.g., how much energy the operations consume), the amounts of time (e.g., processing and/or channel time) required to perform the operations, and/or their (e.g., percentage) likelihoods of success. In other words, the error recovery operations are ordered in this embodiment in increasing cost and/or complexity, such that an error recovery operation ordered farther down the list in the schedule 230 has a greater likelihood of correcting bit error(s) and clearing a codeword but at a cost of more energy consumption and/or processing time. Furthermore, the error recovery operations listed in the rows 241-248 of the schedule 230 are ordered such that the memory device 100 sweeps across a read threshold of a memory region with increasing read offsets (e.g., to check for both retention and endurance issues).

As discussed above, when the memory device 100 (e.g., the controller 106) reads a codeword containing one or more bit errors, the memory device 100 (e.g., the ECC engine 113) can sequentially perform one or more of the error recovery operations in the order established by the schedule 230. For example, the memory device 100 can start by executing a first error recovery operation (e.g., RR0 in the row 241) on the codeword. If the memory device 100 determines that the first error recovery operation successfully corrected the bit error(s), the memory device 100 can terminate its error recovery routine such that it does not perform a next error recovery operation (e.g., RR1 in the row 242) in the schedule 230. In some embodiments and/or in accordance with some operations (e.g., an access operation) of the memory device 100, the memory device 100 can output an original, decoded data string corresponding to the corrected codeword (e.g., to the host device 108).

On the other hand, if the memory device 100 determines that the first error recovery operation (e.g., RR0) did not correct the bit error(s), the memory device 100 can execute the next error recovery operation (e.g., RR1) in the order and so on (e.g., until the bit error(s) are corrected). In some embodiments, if none of the error recovery operations listed in the schedule 230 successfully correct the bit error(s) and/or if the memory device 100 is required to perform an error recovery operation a certain depth in the order established by the schedule 230 (e.g., RR8 in the row 249, AutoCal+pers4 in the row 254, and/or RAID in the row 257), the memory device 100 (*i*) can classify the codeword as unreliable and/or uncorrectable (e.g., UECC), (ii) can schedule and/or perform one or more operations (e.g., refresh operations and/or retirement operations) on a memory region corresponding to where the codeword is saved, and/or (iii) save (e.g., in one or more logs) one or more quality metrics generated during the ECC decode operation (e.g., in response to the event).

As discussed above, the error recovery operations listed in the schedule 230 are ordered such that error recovery operations listed later in the list have a greater likelihood of correcting bit errors and clearing a codeword but at a cost of an increased energy and/or time consumption. In other words, the error recovery operations are ordered in the schedule 230 such that the memory device 100 utilizes less energy and/or time-intensive error recovery operations at a higher frequency than those error recovery operations listed later, reserving higher energy and/or time intensive error recovery operations for codewords having a larger number of bit errors and/or having bit errors that occur as a result of a memory region operating outside of normal and/or expected operations of the memory device 100. Thus, quality metrics regarding which error recovery operation successfully corrected bit errors and cleared a codeword (e.g., how deep into the schedule 230 a memory device 100 had to execute error recovery operations before the bit errors were corrected) provides information about the health and/or quality of a corresponding memory region storing the codeword.

With this in mind, the memory device 100 can classify the error recovery operations into one or more error recovery operation zones of increasing seriousness and/or severity in accordance with the present technology. As shown in FIG. 2, the memory device 100 can classify the error recovery operations into four zones (column 236 of the schedule 230). The first eight error recovery operations in the schedule 230 are classified into zone 1; the next five error recovery operations are classified into zone 2; and the next three error recovery operations are classified into zone 3. The last error recovery operation (e.g., the RAID error recovery operation) is classified into its own zone (i.e., zone 4). In other embodiments, the memory device 100 can classify the error recovery operations into different zones, and/or the memory device 100 can classify the error recovery operations into a greater (e.g., five or more) or lesser (e.g., three or less) number of zones.

In the illustrated embodiment, zone 1 includes error recovery operations that are low energy and/or time intensive (e.g., as shown by their energy scores in the column 235). Because these error recovery operations are ordered higher in the list, the memory device 100 executes these at a greater frequency when correcting bit errors than those error recovery operations lower down the list. The error recovery operations in zone 1 are configured to correct bit errors that occur as a result of normal and expected operation of the memory device 100. For example, zone 1 includes the RR0 error recovery operation (the row 241), which rereads a codeword without an offset to account for bit errors that occur as a result of a large presence of noise when the memory device 100 originally read the codeword. Error recovery operations RR1-RR7 (the rows 242-248) sweep across a read threshold of a corresponding memory region with increasing offsets to account for common calibration, retention, and/or endurance issues of the memory region. In this embodiment, it is expected that the error recovery operations in zone 1 will correct a majority of bit errors encountered when the memory device 100 decodes codewords with minimal consumption of energy and/or time.

Because the memory device 100 expects to execute the error recovery operations in zone 1 frequently and/or as a result of normal and expected operation of the memory device 100, the memory device 100 (e.g., the controller 106) can but need not log each time it executes error recovery operations in zone 1. In some embodiments, the memory device 100 can be configured to store one or more quality metrics (e.g., a memory location of a codeword, error recovery operation(s) executed to correct bit error(s) and clear a codeword, a total count of how many times the memory device 100 has executed error recovery operations on the codeword, a bit error count, etc.) when the memory device 100 executes one or more of the error recovery operations in zone 1. For example, a background scan operation of the memory device 100 can classify a codeword as unreliable and/or as uncorrectable (e.g., UECC) and can store one or more quality metrics of the corresponding memory region in a log if (i) the memory device 100 executes the RR0 error recovery operation (the row 241) and/or (ii) the RR0 operation does not correct the bit error(s). The background scan can also store one or more quality metrics in a log if (i) the RR0 operation does correct the bit error(s) and/or (ii) the bit error count (BEC) of the codeword is greater than (or equal to) a codeword BEC threshold. As described in greater detail below, the one or more quality metrics can be used in post-processing (e.g., by the memory device 100 to make memory management decisions).

Zones 2 and 3 of the schedule 230 include error recovery operations that have a greater likelihood of successfully correcting bit errors and clearing codewords than the error recovery operations in zone 1. Because the error recovery operations require a greater amount of energy and/or time to execute (as shown by their energy scores in the column 235), however, the error recovery operations in zones 2 and 3 are reserved (via the order established in the schedule 230) for codewords that cannot be successfully cleared using the faster and/or less energy intensive error recovery operations in zone 1. In other words, the error recovery operations in zones 2 and 3 may be invoked for codewords exhibiting bit errors that occur as a result of a memory region operating outside normal and/or expected operations of the memory device 100. Thus, if the memory device 100 is required to execute one or more error recovery operations in zones 2 and/or 3 to successfully correct bit errors and to clear a codeword, a memory region corresponding to the where the codeword is saved is likely out of calibration and/or includes one or more defects. As such, the corresponding memory region is at increased risk of corrupting the codeword beyond correction, such that original data corresponding to the codeword may be at risk of becoming irrecoverable. Furthermore, this risk increases the further down the schedule 230 a memory device 100 executes error recovery operations.

Because the memory device 100 is not expected to execute the error recovery operations in zones 2 and 3 frequently and/or during normal and expected operations of the memory device 100, the memory device 100 (e.g., the controller 106) can log each time it executes error recovery operations in zones 2 and/or 3. In some embodiments, the memory device 100 can be configured to store one or more quality metrics (e.g., a memory location of a codeword, error recovery operation(s) executed to correct bit error(s) and clear a codeword, a total count of how many times the memory device 100 has executed error recovery operations on the codeword, a bit error count, etc.) when the memory device 100 executes one or more of the error recovery operations in zones 2 and/or 3. As described in greater detail below, the one or more quality metrics can be used in post-processing (e.g., by the memory device 100 to make memory management decisions).

In the illustrated embodiment, zone 4 in the schedule 230 includes only the RAID error recovery operation. In other embodiments, other error recovery operations (e.g., RAIN recovery operations) can be classified (e.g., by the memory device 100) into zone 4 in addition to or in lieu of the RAID error recovery operation. As shown in column 235 of the schedule 230, the RAID error recovery operation is extremely energy and/or time intensive. Thus, it is reserved for codewords (via the order established in the schedule 230) having bit errors that cannot be corrected by each of the error recovery operations in zones 1, 2, and 3 of the schedule 230. In other words, the error recovery operation(s) in zone 4 are reserved for codewords exhibiting bit errors that occur as a result of a corresponding memory region operating significantly out of calibration and/or having one or more serious defects. Thus, if the memory device 100 is required to execute one or more error recovery operations in zone 4 (e.g., the RAID error recovery operation corresponding to a RAID event), the corresponding memory region is at an elevated risk of corrupting a codeword beyond correction. Furthermore, if the error recovery operation(s) in zone 4 cannot correct bit errors in the codeword, the original data corresponding to the uncorrectable codeword may be irrecoverably lost. This is referred to as a UECC event. Therefore, the memory device 100 can log each time it executes the error recovery operation(s) in zone 4. In some embodiments, the memory device 100 can be configured to store one or more quality metrics (e.g., a memory location of a codeword, error recovery operation(s) executed to correct bit error(s) and clear a codeword, a total count of how many times the memory device 100 has executed error recovery operation on the codeword, a bit error count, etc.) when the memory device 100 executes error recovery operations in zone 4. As described in greater detail below, the one or more quality metrics can be used in post-processing (e.g., by the memory device 100 to make memory management decisions).

As discussed above, the memory device 100 can use one or more saved events and/or quality metrics to make memory management and/or other decisions. For example, the memory device 100 can retrieve the saved information from memory (e.g., the memory component 102) and can decide to refresh and/or retire a memory region based, at least in part, on whether the memory device 100 executed one or more error recovery operation(s) from particular error recovery operation zones on one or more codewords saved in the memory region. In these and other embodiments, the memory device can decide to refresh and/or retire a memory region based, at least in part, on whether the memory device 100 executed a certain number of one or more error recovery operations (e.g., from a particular error recovery operation zone) on one or more codewords saved in the memory region in comparison to an error recovery operation count threshold. In these and still other embodiments, the memory device 100 can decide to refresh and/or retire a memory region based, at least in part, on whether a certain number of codewords saved in the memory region (i) have bit error counts exceeding a codeword BEC threshold in comparison to a codeword BEC event threshold and/or (ii) are classified an unreliable and/or uncorrectable (e.g., UECC) in comparison to a UECC event threshold.

In this manner, memory devices 100 configured in accordance with the present technology can proactively discover, refresh (e.g., correct), and/or remove less capable, potentially defective, and/or poor performing memory regions before they become an error recovery problem. Rather than (i) repeatedly handling a defective and/or problematic memory region with an error recovery routine and/or (ii) waiting for a memory region to enter a RAID, RAIN and/or UECC state, memory devices 100 configured in accordance with embodiments of the present technology can accelerate discovery, refreshment (e.g., correction), and/or removal of less capable, potentially defective, and/or problematic memory regions (e.g., using lower error recovery thresholds) while bit errors in a codeword are correctable and/or while original data corresponding to the codeword is not at elevated risk of becoming irrecoverable. Thus, the memory devices 100 configured in accordance with the present technology are expected to reduce data storage reliability issues.

Figure 3:
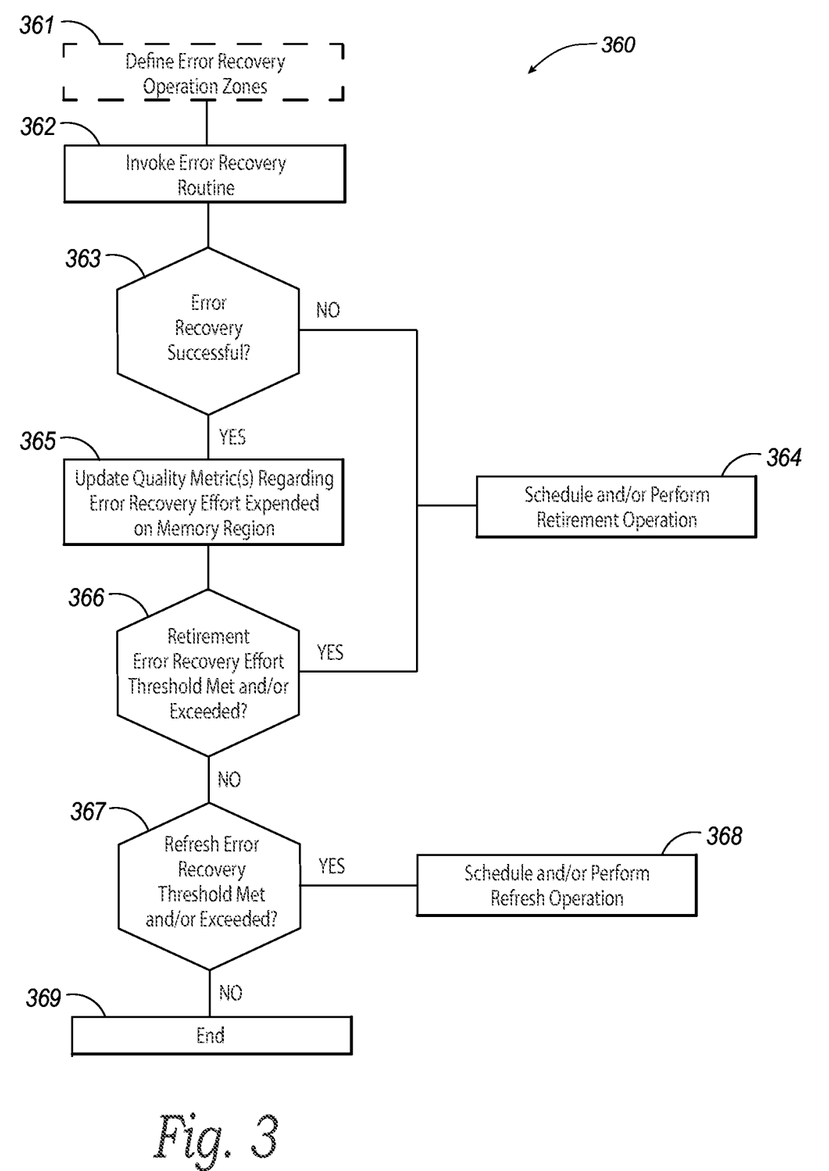
FIGS. 3 and 4 are a flow diagram illustrating memory management routines that are executed, at least in part, by a memory device configured in accordance with embodiments of the present technology.

FIG. 3 is a flow diagram illustrating a memory management routine 360 that is executed, at least in part, by a memory device (e.g., the memory device 100) configured in accordance with the present technology. In some embodiments, the routine 360 can be carried out by components of a memory device controller (e.g., the processor 110, the ECC engine 113, and/or the embedded memory 132 of the controller 106) and/or by components of a memory component (e.g., the memory component 102 of the memory device 100). In these and other embodiments, all or a subset of the steps of the routine 360 can be performed by other components of the memory device 100, by components of a host device (e.g., the host device 108), and/or by other components of the system 101.

The routine 360 can begin at block 361 to define one or more error recovery operation zones. For example, the routine 360 can classify one or more error recovery operations of the memory device 100 into one or more error recovery operation zones of increasing seriousness and/or severity. In these and other embodiments, the routine 360 can classify error recovery operations into zones on a basis of energy scores, on a basis of time (e.g., processing time) consumption, and/or on a basis of likelihood of success. For example, the routine 360 can classify the error recovery operations into four zones. In these embodiments, the routine 360 can classify one or more error recovery operations into zone 1 that are (i) low energy and/or time intensive and/or (ii) configured to correct bit errors that occur as a result of normal and/or expected operation of the memory device 100. The routine 360 can classify one or more error recovery operations into zone 2 that (i) have a higher energy and/or time consumption than the error recovery operations in zone 1 and/or (ii) are configured to correct bit errors that occur as a result of defects in a memory region and/or as a result of the memory region being out of calibration. The routine 360 can classify one or more error recovery operations into zone 3 that (i) have a higher energy and/or time consumption than the error recovery operations in zones 1 and/or 2 and/or (ii) are configured to correct bit errors that occur as a result of defects in a memory region and/or as a result of the memory region being significantly out of calibration. The routine 360 can classify one or more error recovery operations into zone 4 that (i) have a higher energy and/or time consumption than the error recovery operations in zones 1, 2, and/or 3 and/or (ii) are configured to correct bit errors that occur as a result of defects in a memory region and/or as a result of the memory region being severely out of calibration.

In other embodiments, the routine 360 can classify error recovery operations of the memory device 100 into different zones, into a greater (e.g., five or more) or lesser (e.g., three or less) number of zones, and/or into zones based on one or more different factors and/or considerations. In these and still other embodiments, the routine 360 can reclassify one or more of the error recovery operations at block 361. For example, the routine 360 can classify and/or reclassify error recovery operations into one or more error recovery operation zones in response to a command (e.g., a VS command). In these and other embodiments, the routine 360 can (e.g., dynamically) reclassify the error recovery operations, rearrange the error recovery operation zones, and/or alter error recovery effort thresholds based on the age and/or endurance of the memory device 100 (e.g., the memory component 102). In this manner, the routine 360 can improve (e.g., increase and/or decrease) memory region refresh and/or retirement rates (e.g., as the memory device 100 nears end of life endurance).

Alternatively, the routine 360 can begin at block 362 to invoke an error recovery routine. For example, the routine 360 can begin at block 362 when the error recovery operation zones are preset during manufacture of the memory device 100. In other embodiments, the routine 360 can begin at block 362 when the routine 360 has previously defined the error recovery operation zones (e.g., in a previous iteration of the routine 360).

At block 360, the routine 360 can invoke an error recovery routine when the routine 360 identifies bit errors in a codeword saved to a memory region in the memory device 100 (e.g., the memory component 102, the embedded memory 132, etc.). In these and other embodiments, the routine 360 can invoke the error recovery routine during an access and/or scan operation of the memory device 100. In some embodiments, the routine 360 can wait for the memory device 100 to execute the error recovery routine before proceeding to block 363. In other embodiments, the routine 360 can execute the error recovery routine before proceeding to block 363 (e.g., in accordance with an error recovery schedule, such as error recovery schedule 230).

At block 363, the routine 360 determines whether the error recovery routine successfully corrected bit errors and cleared the codeword. If the routine 360 determines that the error recovery routine did not successfully correct the bit errors and clear the codeword, the routine 360 can (i) classify the codeword as uncorrectable (e.g., UECC) and/or (ii) can proceed to block 364 to schedule and/or perform a retirement operation (e.g., an immediate retirement operation) on a memory region corresponding to where the codeword was stored. By performing a retirement operation on the corresponding memory region, the routine 360 can remove the corresponding memory region from a pool of active memory regions that the memory device 100 uses to store data. Thus, the routine 360 can prevent the memory device 100 from storing data to the corresponding memory region so that the data is not corrupted and/or lost by the corresponding memory region. In some embodiments, the routine 360 can update quality metric(s) regarding error recovery efforts expended on the corresponding memory region (at block 364), such as an indication that the corresponding memory region was retired (e.g., for post-processing analysis).

On the other hand, if the routine 360 determines that the error recovery routine successfully corrected bit errors and cleared the codeword at block 363, the routine 360 can proceed to block 365 to update quality metric(s) regarding error recovery efforts expended on a memory region corresponding to where the codeword was stored. For example, the quality metric(s) can include (i) a memory location of the codeword; (ii) a bit error count of the codeword; (iii) an indication of an error recovery operation that successfully corrected the bit errors and cleared the codeword; (iv) an indication of an error recovery operation zone of the error recovery operation; (v) a count indicating a number of times a particular error recovery operation and/or error recovery operations from a particular error recovery operation zone have been executed on one or more codewords stored in the corresponding memory region; (vi) a count of how many refresh and/or retirement operations have been performed on the corresponding memory region; and/or (vi) counts and/or indications of other events (e.g., UECC events, codeword BEC threshold events, etc.). In some embodiments, quality metric(s) can be generated during the error recovery routine. In these embodiments, the routine 360 can update quality metric(s) with the newly generated quality metric(s). In these and other embodiments, the routine 360 can save the newly generated quality metric(s) to the memory device 100 (e.g., in the memory component 102, in the embedded memory 132, etc.). In these and still other embodiments, the routine 360 can save the quality metrics in one or more logs (e.g., of one or more other routines of the memory device 100).

Referring to blocks 366 and 367 together, the routine 360 determines whether a retirement error recovery effort threshold and/or a refresh error recovery effort threshold, respectively, have been met and/or exceeded. The routine 360 can compare the updated quality metric(s) to one or more error recovery operation depth thresholds to identify, refresh, and/or retire a corresponding memory region exhibiting defects and/or calibration issues greater than and/or equal to a particular defect and/or calibration severity. In some embodiments, a depth threshold can be a particular error recovery operation zone in the error recovery schedule 230. For example, a depth threshold can be error recovery operation zone 2 such that if one or more error recovery operations in error recovery operation zones 2, 3, and/or 4 were executed on the codeword during the error recovery routine, the routine 360 can proceed to block 364 to schedule and/or perform a (e.g., immediate) retirement operation on the corresponding memory region or can proceed to block 368 to schedule and/or perform a (e.g., immediate) refresh operation on the corresponding memory region. In these and other embodiments, if the memory region 100 only executed one or more error recovery operations in error recovery operation zone 1 on the codeword during the error recovery routine, the routine 360 does not proceed to blocks 364 or 368 to schedule refresh or retirement operations on the memory region because the depth threshold (e.g., error recovery operation zone 2) is not met and/or exceeded. In other embodiments, the routine 360 can proceed to blocks 364 or 368 to schedule and/or perform refresh and/or retirement operations on the memory region only if the memory device 100 executed one or more error recovery operations in zones 3 and/or 4 (i.e., executed one or more error recovery operations in error recovery operation zones strictly beyond the depth threshold of error recovery 2) on the codeword during the error recovery routine. In these and other embodiments, the routine 360 (i) can proceed to block 364 to schedule and/or perform a retirement operation on the corresponding memory region if one or more error recovery operations in an error recovery operation zone (e.g., zone 3 and/or zone 4) beyond the depth threshold (e.g., zone 2) were executed on the codeword during the error recovery routine or (ii) can proceed to block 368 to schedule and/or perform a refresh operation on the corresponding memory region if one or more error recovery operations in only an error recovery operation zone (e.g., zone 2) meeting the depth threshold (e.g., zone 2) were executed on the codeword during the error recovery routine.

In these and other embodiments, an error recovery operation depth threshold can be particular ones of the error recovery operation in the error recovery schedule 230. For example, depth thresholds can be the RR8 operation (the row 249) and/or the RR0+pers4+Soft operation (the row 256) in the schedule 230. In this example, if the RR8 operation and/or one or more error recovery operations deeper into the order established by the schedule 230 were performed on the codeword during the error recovery routine, the routine 360 can proceed to block 368 to schedule and/or perform a (e.g., immediate) refresh operation on the corresponding memory region. Additionally or alternatively, if the memory device 100 executes the RR0+pers4+Soft operation and/or one or more error recovery operations deeper into the order established by the schedule 230 (e.g., the RAID operation in the row 257) on the codeword during the error recovery routine, the routine 360 can proceed to block 364 to schedule and/or perform a (e.g., immediate) retirement operation on the corresponding memory region.

Additionally or alternatively, the routine 360 can compare the updated quality metric(s) to one or more error recovery routine iteration count thresholds to identify, refresh, and/or retire memory regions on which the memory device 100 repeatedly executes error recovery operations (e.g., from a particular error recovery operation zone). In some embodiments, an error recovery routine iteration count threshold can be a number (e.g., one, two, three, five, ten, etc.) of iterations of the error recovery routine where an error recovery operation from a from a particular error recovery operation zone corrected bit errors in one or more codewords stored in a memory region. For example, a routine iteration count threshold for error recovery operation zone 2 can be three iterations and a routine iteration count threshold for error recovery operation zone 3 can be two iterations. In this example, the routine 360 can proceed to blocks 364 or 368 to schedule and/or perform (e.g., immediate) refresh and/or retirement operations on a memory region if (i) one or more error recovery operations in zone 2 corrected bit errors in one or more codewords stored in the memory region in greater than and/or equal to three iterations of the error recovery routine and/or (ii) one or more error recovery operations in zone 3 corrected bit errors in one or more codewords stored in the memory region in greater than or equal to two iterations of the error recovery routine. In these and other embodiments, the routine 360 can proceed to block 368 to schedule and/or perform a (e.g., immediate) refresh operation on the memory region if the error recovery routine iteration count threshold for zone 2 is met and/or exceeded, whereas the routine 360 can proceed to block 364 to schedule and/or perform a (e.g., immediate) retirement operation on the memory region if the error recovery routine iteration count threshold for zone 3 is met and/or exceeded. In these and still other embodiments, the routine 360 can proceed to blocks 364 or 368 to schedule and/or perform (e.g., immediate) refresh and/or retirement operations on the memory region if neither error recovery routine iteration count threshold for zone 2 and/or zone 3 is met, but a combination error recovery routine iteration count threshold is met. For example, the routine 360 can proceed to blocks 364 or 368 to schedule and/or perform (e.g., immediate) refresh and/or retirement operations on the memory region if one or more error recovery operations in zones 2 and/or 3 corrected bit errors in one or more codewords in the memory region in a total of three iterations of the error recovery routine. In this example, the routine 360 can proceed to blocks 364 or 368 if one or more error recovery operations in zone 2 corrected bit errors in one or more codewords in the memory region in two iterations of the error recovery routine and one or more error recovery operations in zone 3 corrected bit errors in one or more codewords in the memory region in another iteration of the error recovery routine (i.e., a total of three iterations of the error recovery routine in which one or more error recovery operations in zones 2 and 3 corrected bit errors in one or more codewords in the memory region) even though neither of the error recovery routine iteration count thresholds for zones 2 and 3 individually have been met and/or exceeded.

In these and still other embodiments, an error recovery operation zone can have more than one error recovery routine iteration count thresholds. For example, zone 3 can have a high error recovery routine iteration count threshold of three iterations of the error recovery routine and a low error recovery routine iteration count threshold of one iteration of the error recovery routine. In this example, the routine 360 can be configured to proceed to block 368 to schedule and/or perform a (e.g., immediate) refresh operation on a memory region if one or more error recovery operations in zone 3 corrected bit errors in one or more codewords stored in the memory region in one or two iterations of the error recovery routine (i.e., if the low error recovery routine iteration count threshold was met and/or exceeded). On the other hand, the routine 360 can be configured to proceed to block 364 to schedule and/or perform a (e.g., immediate) retirement operation on the memory region if one or more error recovery operations in zone 3 corrected bit errors in one or more codewords stored in the memory region in three or more iterations of the error recovery routine (i.e., if the high error recovery routine iteration count threshold was met and/or exceeded). In these and still other embodiments, an error recovery operation zone (e.g., zone 1) can lack an error recovery routine iteration count threshold such that the routine 360 does not proceed to blocks 364 or 368 to schedule and/or perform refresh and/or retirement operations on a memory region based on a number of iterations of the error recovery routine in which one or more error recovery operations in that zone (e.g., zone 1) corrected bit errors in one or more codewords stored in the memory region.

In these and other embodiments, the routine 360 can compare the updated quality metric(s) to one or more uncorrectable codeword (e.g., UECC) event count thresholds to identify, refresh, and/or retire memory regions storing codewords with bit errors that one or more error recovery operations of the memory device 100 cannot correct. In some embodiments, an UECC event count threshold can be a number (e.g., one, two, three, five, ten, sixteen, etc.) of UECC events. For example, if the first error recovery operation in the error recovery schedule 230 (e.g., the RR0 operation in the row 241) cannot correct bit errors in a codeword, the memory device 100 can classify the codeword as uncorrectable at RR0 (e.g., UECC at RR0), which the routine 360 registers as a UECC at RR0 event. In this example, a first UECC event count threshold can be one UECC at RR0 event such that the routine 360 can proceed to block 368 to schedule and/or perform a (e.g., immediate) refresh operation on the memory region storing the UECC at RR0 codeword. In these and other embodiments, a second UECC event count threshold can be eight UECC at RR0 events such that the routine 360 can proceed to block 364 to schedule and/or perform a (e.g., immediate) retirement operation on the memory region storing the UECC at RR0 codeword(s). In this example, the routine 360 can proceed to block 368 to schedule and/or perform (e.g., immediate) refresh operations on the memory region for the first seven and/or eight UECC at RR0 events.

Additionally or alternatively, the routine 360 can compare the updated quality metric(s) to one or more codeword bit error count (BEC) event count thresholds to identify, refresh, and/or retire memory regions storing one or more codewords having BEC's greater than and/or equal to a codeword BEC threshold. If a codeword stored in a memory region has a BEC (e.g., 42 bit errors) greater than and/or equal to a codeword BEC threshold (e.g., 40 bit errors), the routine 360 can register this as a codeword BEC event. In some embodiments, a codeword BEC event count threshold can be a number (e.g., one, two, three, five, ten, sixteen, etc.) of codeword BEC events. For example, a codeword BEC event count threshold can be one codeword BEC event such that the routine 360 can proceed to blocks 364 or 368 to schedule and/or perform (e.g., immediate) refresh and/or retirement operations on a memory region storing a codeword that triggered the routine 360 to register a codeword BEC event. As another example, a first codeword BEC event count threshold can be one codeword BEC event such that the routine 360 can proceed to block 368 to schedule and/or perform a (e.g., immediate) refresh operation on a memory region storing a codeword that triggered the routine 360 to register a codeword BEC event. In these and other embodiments, a second codeword BEC event count threshold can be 16 codeword BEC events such that the routine 360 can proceed to block 364 to schedule and/or perform a (e.g., immediate) retirement operation on a memory region storing one or more codewords that triggered the routine 360 to register a total of 16 or more codeword BEC events. In this example, the routine 360 can proceed to block 368 to schedule and/or perform (e.g., immediate) refresh operations on the memory region for the first fifteen and/or sixteen codeword BEC events the routine 360 registers regarding the memory region.

In some embodiments, the routine 360 can proceed to blocks 364 or 368 based on a combination count threshold of UECC and codeword BEC events. For example, a combination UECC and codeword BEC event threshold can be ten total UECC at RR0 and/or codeword BEC events. In this example, the routine 360 can proceed to blocks 364 or 368 to schedule and/or perform (e.g., immediate) refresh and/or retirement operations on a memory region storing one or more codewords that triggered the routine 360 to register a total of ten or more UECC at RR0 and/or codeword BEC events. In these and still other embodiments, the routine 360 can use different thresholds than the thresholds described above, and/or any of the thresholds described above can be combined together and/or with one or more of the different thresholds (e.g., to create different thresholds in addition to or in lieu of the thresholds described above)

In some embodiments, one or more of the thresholds used by the routine 360 can be preset and/or predetermined. For example, one or more of the thresholds can be preset and/or predetermined during manufacture of the memory device 100 and/or during an operation (e.g., a calibration operation) of the memory device 100. In these and other embodiments, one or more of the thresholds can be changed (e.g., in response to a VS command) and/or can be determined based on quality metrics of memory regions in the memory device 100 (e.g., during execution of the routine 360).

In some embodiments, the routine 360 can wait to check all defined thresholds before proceeding to blocks 364 and/or 368 (e.g., to determine whether to refresh or to retire a memory region). In these and other embodiments, the routine 360 can return to blocks 366 and/or 367 from blocks 364 and/or 368 to check a different and/or a same memory region against a different and/or a same threshold. In these and other embodiments, the routine can update quality metric(s) regarding error recovery efforts expended on a memory region before, during, and/or after proceeding to block 364 or 368. For example, the routine 360 can update quality metric(s) to indicate that a refresh operation was scheduled and/or performed on the memory region (at block 368) and/or to indicate that a retirement operation was scheduled and/or performed on the memory region (at block 364). In these and still other embodiments, the routine 360 is not required to update quality metric(s) regarding certain error recovery efforts expended on a memory region. For example, the routine 360 in some embodiments need not update quality metric(s) when one or more error recovery operations in error recovery operation zone 1 are executed on the memory region during one or more iterations of an error recovery routine (e.g., because these operations/iterations (i) do not meet and/or exceed any error recovery thresholds and/or (ii) do not trigger the routine 360 to schedule and/or perform a refresh and/or a retirement operation on the memory region). In other embodiments, the routine 360 can decide to (e.g., proactively) refresh the memory region even if none of the error recovery thresholds are met and/or exceeded (e.g., to prevent imprint effects and/or potential bit errors in future reads).

If a memory region does not meet and/or exceed any of the enhanced memory management thresholds, the routine 360 can proceed to block 369. At block 369, the routine 360 can terminate by, for example, keeping the memory region in an active pool of memory regions such that the memory device 100 can continue to store data at and/or to the memory region. In these and other embodiments, the routine 360 can terminate by returning to blocks 361 and/or 362 (e.g., to manage a same and/or a next memory region).

Although the steps of the routine 360 are discussed and illustrated in a particular order, the method illustrated by the routine 360 in FIG. 3 is not so limited. In other embodiments, the method can be performed in a different order. In these and other embodiments, any of the steps of the routine 360 can be performed before, during, and/or after any of the other steps of the routine 360. Moreover, a person of ordinary skill in the relevant art will readily recognize that the illustrated method can be altered and still remain within these and other embodiments of the present technology. For example, one or more steps of the routine 360 illustrated in FIG. 3 can be omitted and/or repeated in some embodiments.

Figure 4:
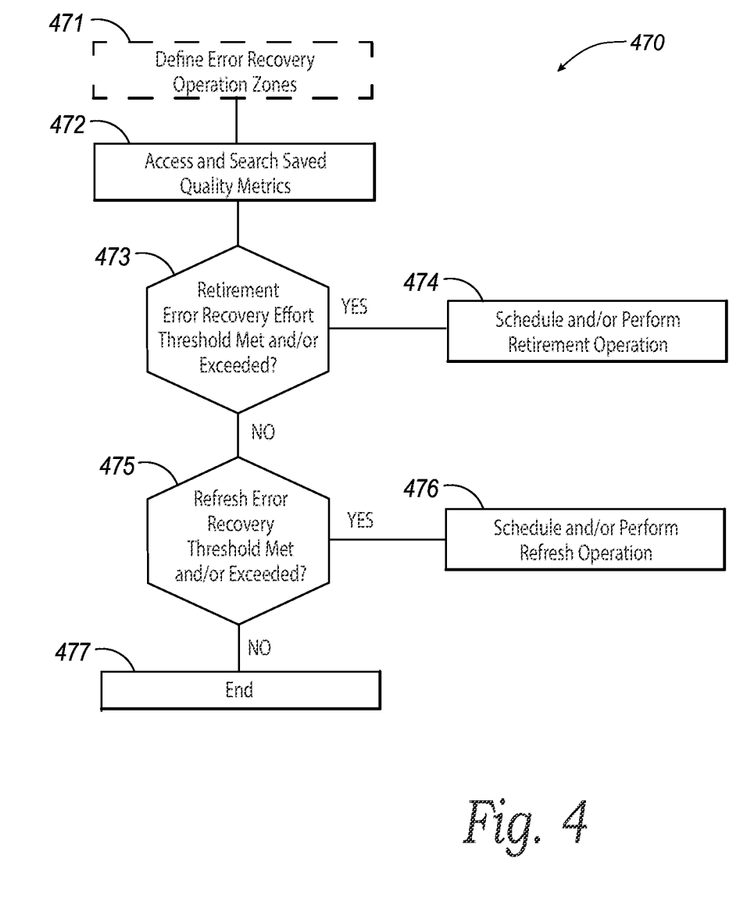

FIG. 4 is a flow diagram illustrating a memory management routine 470 that is executed, at least in part, by a memory device (e.g., the memory device 100) configured in accordance with the present technology. In some embodiments, the routine 470 can be carried out by components of a memory device controller (e.g., the processor 110, the ECC engine 113, and/or the embedded memory 132 of the controller 106) and/or by components of a memory component (e.g., the memory component 102 of the memory device 100). In these and other embodiments, all or a subset of the steps of the routine 470 can be performed by other components of the memory device 100, by components of a host device (e.g., the host device 108), and/or by other components of the system 101.

As shown, the routine 470 is similar to the routine 360. For example, at block 471 the routine 470 can define one or more error recovery operation zones (similar to the routine 360 at block 361). In addition, the routine 470 can compare one or more quality metrics regarding error recovery effort expended on a memory region to one or more error recovery thresholds at blocks 473 and 475 (similar to the routine 360 at blocks 366 and 367), and/or the routine 470 can schedule and/or perform refresh and/or retirement operations on memory regions at blocks 474 and 476 (similar to the routine 360 at blocks 364 and 368).

The routine 470 differs from the routine 360, however, in that the routine 470 can be performed apart from an error recovery routine of the memory device 100 and/or can be performed as a post-processing operation (e.g., as a background operation, when the memory device 100 is idle, etc.) of one or more other operations of the memory device 100. Thus, at block 472, the routine 470 can access and search one or more logs and/or quality metrics stored in memory (e.g., the memory component 102, the embedded memory 132, etc.) that the memory device 100 is configured to generate during various operations (e.g., an ECC decode operation) of the memory device 100 and/or is configured to save to memory in response to an event (e.g. a trigger event). For example, the routine 470 can access quality metrics generated by the memory device 100 and/or saved to memory regarding one or more events where the memory device 100 executes an error recovery operation beyond a particular error recovery operation zone (e.g., beyond zone 1, 2 and/or 3). In some embodiments, the quality metrics can include a memory location of a corresponding codeword, an error recovery operation that successfully corrected bit errors in the codeword, a zone of the error recovery operation, and/or a count indicating a number (e.g., one, two, three, five, ten, etc.) of iterations of the error recovery routine where an error recovery operation from a from a particular error recovery operation zone corrected bit errors in one or more codewords stored in a memory region (e.g., in the past). In these and other embodiments, the routine 470 can access quality metrics generated by the memory device 100 (e.g., during a background scan operation) and/or saved to memory regarding (i) one or more events where all or a subset of available error recovery operations do not correct bit errors in a codeword (e.g., a UECC event) and/or (ii) an indication of a number of times the memory device 100 has read one or more codewords in a memory region that have had a bit error count (BEC) greater than and/or equal to a codeword BEC threshold (e.g., an indication of the number of codeword BEC events). In these and still other embodiments, the routine 470 can access other quality metrics and/or other information regarding memory regions in the memory device 100 generated by the memory device 100 and/or saved to memory (e.g., the memory component 102).

The routine 470 can search (e.g., filter) the saved logs and/or quality metrics for information indicating a poor performing and/or potentially defective memory region (e.g., a memory page, a memory block, a memory die 120, a superblock, a stripe of memory pages, a memory channel, etc.). In some embodiments, the routine 470 can search for memory regions that store one or more codewords on which the memory device 100 executed (i) particular error recovery operations, and/or (ii) one or more error recovery operations from particular error recovery operation zones. For example, the routine 470 can search for memory regions storing one or more codewords on which the memory device 100 has executed an error recovery operation from error recovery operation zones 2, 3, and/or 4. In these and other embodiments, the routine 470 can search for memory regions that are repeat offenders. For example, the routine 470 can search for memory regions storing one or more codewords on which the memory device 100 performed a certain number of iterations of an error recovery routine in which one or more error recovery operations from particular error recovery operation zones successfully corrected bit errors in the one or more codewords. In these and still other embodiments, the routine 470 can search for memory regions storing one or more codewords that have been classified as uncorrectable (UECC) by operations (e.g., an error recovery operation and/or a background scan operation) of the memory device 100 and/or triggered a UECC (e.g., at RR0) event. In these and still other embodiments, the routine 470 can search for memory regions storing one or more codewords having a certain number of bit errors and/or that triggered a codeword BEC event. In still other embodiments, the routine 470 can search for other information and/or can search on a different basis (e.g., by codeword, by error recovery operation, etc.) than by memory region.

At blocks 473 and 475, the routine 470 can compare the one or more accessed quality metrics and compare the quality metrics to one or more error recovery thresholds similar to the routine at blocks 363, 366, and/or 367. Based at least in part on this comparison, the routine 470 can schedule and/or perform refresh and/or retirement operations on one or more memory regions at blocks 474 and/or 476 similar to the routine 360 at blocks 364 and/or 368. In these and other embodiments, the routine 470 can update quality metric(s) regarding one or more memory regions (e.g., to indicate that a memory region has been refresh and/or retired). In these and still other embodiments, the routine 470 can proceed to block 477 to terminate. For example, the routine 470 can keep one or more memory regions in an active pool of memory regions such that the memory device 100 can continue to store data at and/or to the memory regions. In these and other embodiments, the routine 360 can terminate by returning to blocks 471 and/or 472 (e.g., to search a same and/or a different log for same and/or different information regarding a same and/or different memory region).

Although the steps of the routine 470 are discussed and illustrated in a particular order, the method illustrated by the routine 470 in FIG. 4 is not so limited. In other embodiments, the method can be performed in a different order. In these and other embodiments, any of the steps of the routine 470 can be performed before, during, and/or after any of the other steps of the routine 470. Moreover, a person of ordinary skill in the relevant art will readily recognize that the illustrated method can be altered and still remain within these and other embodiments of the present technology. For example, one or more steps of the routine 470 illustrated in FIG. 4 can be omitted and/or repeated in some embodiments. Additionally or alternatively, any of the steps of the routine 470 can be combined with any of the steps of the routine 360 (FIG. 3).

Figure 5:
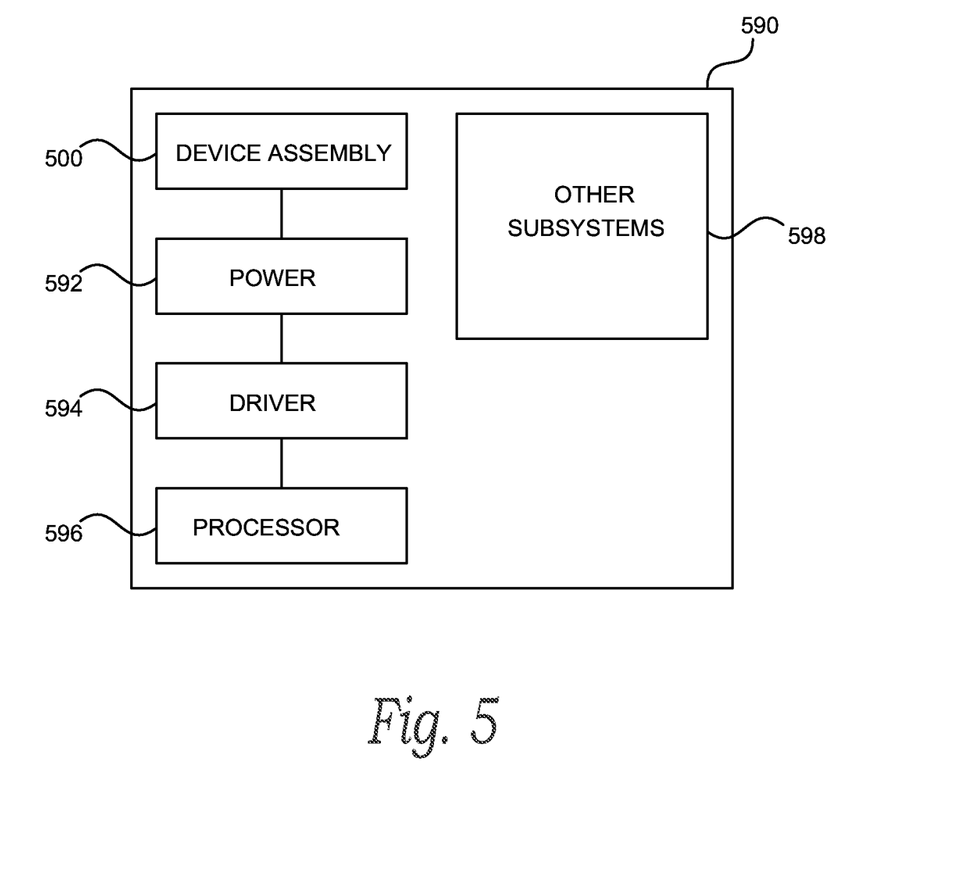
FIG. 5 is a schematic view of a system that includes a memory device configured in accordance with embodiments of the present technology.

FIG. 5 is a schematic view of a system that includes a memory device in accordance with embodiments of the present technology. Any one of the foregoing memory devices described above with reference to FIGS. 1-4 can be incorporated into any of a myriad of larger and/or more complex systems, a representative example of which is system 590 shown schematically in FIG. 5. The system 590 can include a semiconductor device assembly 500, a power source 592, a driver 594, a processor 596, and/or other subsystems and components 598. The semiconductor device assembly 500 can include features generally similar to those of the memory device described above with reference to FIGS. 1-4, and can, therefore, include various features of memory content authentication. The resulting system 590 can perform any of a wide variety of functions, such as memory storage, data processing, and/or other suitable functions. Accordingly, representative systems 590 can include, without limitation, hand-held devices (e.g., mobile phones, tablets, digital readers, and digital audio players), computers, vehicles, appliances, and other products. Components of the system 590 may be housed in a single unit or distributed over multiple, interconnected units (e.g., through a communications network). The components of the system 590 can also include remote devices and any of a wide variety of computer readable media.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those of ordinary skill in the relevant art will recognize. For example, the routines 360 and/or 470 can be standalone operations of the memory device 100 such that the routine 360 is executed independent other operations (e.g., error recovery operations) of the memory device 100. In other embodiments, the routines 360 and/or 470 can be incorporated into one or more other operations (e.g., error recovery operations, error avoidance operations, background scan, etc.) of the memory device 100 such that the routine 360 can be invoked as part of the one or more other operations. In addition, although steps are presented in a given order, alternative embodiments may perform steps in a different order. The various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising," "including," "having," and "with" are used throughout to mean including at least the recited feature(s) such that any greater number of the same feature and/or additional types of other features are not precluded.

From the foregoing, it will also be appreciated that various modifications may be made without deviating from the disclosure. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

We claim:

1. A system, comprising:
   a memory component comprising a plurality of memory regions; and
   a processing device operably connected to the memory component, wherein the processing device is configured to:
   in response to a determination that a codeword stored to a first memory region of the plurality of memory regions contains a bit error, correct the bit error by performing an error correction operation on the codeword; and
   after correcting the bit error
   determine, based at least in part on a cost function of the error correction operation, whether the first memory region has exceeded a first predetermined threshold of error correction effort,
   perform, when the first memory region has exceeded the first predetermined threshold of error correction effort, a first remedial action on the first memory region, wherein the first remedial action is a refresh of the first memory region or a retirement of the first memory region,
   determine, when the first memory region has not exceeded the first predetermined threshold of error correction effort, whether the first memory region has exceeded a second predetermined threshold of error correction effort based at least in part on the cost function of the error correction operation, and
   perform, when the first memory region has exceeded the second predetermined threshold of error correction effort, a second remedial action on the first memory region.

2. The system of claim 1, wherein the cost function corresponds to an energy expenditure of the error correction operation, a duration of the error correction operation, or a combination thereof.

3. The system of claim 1, wherein the determination of whether the first memory region has exceeded the first predetermined threshold of error correction effort is further based in part on one or more previous error correction operations corresponding to the first memory region.

4. The system of claim 3, wherein the first predetermined threshold of error correction effort corresponds to a number of the one or more previous error correction operations, one or more cost functions of the one or more previous error correction operations, or a combination thereof.

5. The system of claim 1, wherein the first remedial action is a retirement of the first memory region, and wherein the second remedial action is a refresh of the first memory region.

6. The system of claim 1, wherein the error correction operation comprises an ordered list of error correction steps sorted at least in part in an ascending order according to the cost function.

7. The system of claim 6, wherein the ordered list of error correction steps is arranged in a plurality of zones, with at least one zone corresponding to two or more of the error correction steps, and wherein the determination of whether the first memory region has exceeded the first predetermined threshold or the second predetermined threshold of error correction effort is based at least in part on which of the plurality of zones corresponds to successful completion of the error correction operation.

8. The system of claim 6, wherein the processing device is configured to perform the error correction steps in order until either the error correction operation is successful or the ordered list of error correction steps is completed.

9. The system of claim 6, wherein whether the first memory region has exceeded the first predetermined threshold or the second predetermined threshold is based at least in part on (i) which one of the error correction steps in the ordered list corrected the bit error and (ii) on a depth of the one of the error correction steps from a start of the ordered list.

10. A method, comprising:
  correcting a bit error contained in a codeword stored to a first memory region, wherein the correcting includes performing an error correction operation on the codeword; and
  after correcting the bit error
    determining, based at least in part on a cost function of the error correction operation, whether the first memory region has exceeded a first predetermined threshold of error correction effort,
    performing, when the first memory region has exceeded the first predetermined threshold of error correction effort, a first remedial action on the first memory region, wherein the first remedial action is a refresh of the first memory region or a retirement of the first memory region,
    determining, when the first memory region has not exceeded the first predetermined threshold of error correction effort, whether the first memory region has exceeded a second predetermined threshold of error correction effort based at least in part on the cost function of the error correction operation, and
    performing, when the first memory region has exceeded the second predetermined threshold of error correction effort, a second remedial action on the first memory region.

11. The method of claim 10, wherein the cost function corresponds to an energy expenditure of the error correction operation, a duration of the error correction operation, or a combination thereof.

12. The method of claim 10, wherein the first predetermined threshold of error correction effort corresponds to a number of the one or more previous error correction operations, one or more cost functions of the one or more previous error correction operations, or a combination thereof.

13. The method of claim 10, wherein the first remedial action is a retirement of the first memory region, and wherein the second remedial action is a refresh of the first memory region.

14. The method of claim 10, wherein the error correction operation comprises an ordered list of error correction steps sorted at least in part in an ascending order according to the cost function, and wherein the method further comprises performing the error correction steps in order until the error correction operation is successful or the ordered list of error correction steps is completed.

15. The method of claim 14, wherein the ordered list of error correction steps is arranged in a plurality of zones, with at least one zone corresponding to two or more of the error correction steps, and wherein the determination of whether the first memory region has exceeded the first predetermined threshold or the second predetermined threshold of error correction effort is based at least in part on which of the plurality of zones corresponds to successful completion of the error correction operation.

16. The method of claim 14, wherein whether the first memory region has exceeded the first predetermined threshold or the second predetermined threshold is based at least in part on (i) which one of the error correction steps in the ordered list corrected the bit error and (ii) a depth of the one of the error correction steps from a start of the ordered list.

17. A non-transitory computer-readable storage medium comprising instructions that, when executed by a processing device, cause the processing device to:
  correct a bit error contained in a codeword stored to a first memory region by performing an error correction operation on the codeword; and
  after correcting the bit error
    determine, based at least in part on a cost function of the error correction operation, whether the first memory region has exceeded a first predetermined threshold of error correction effort,
    perform, when the first memory region has exceeded the first predetermined threshold of error correction effort, a first remedial action on the first memory region, wherein the first remedial action is a refresh of the first memory region or a retirement of the first memory region,
    determine, when the first memory region has not exceeded the first predetermined threshold of error correction effort, whether the first memory region has exceeded a second predetermined threshold of error correction effort determine based at least in part on the cost function of the error correction operation, and
    perform, when the first memory region has exceeded the second predetermined threshold of error correction effort, a second remedial action on the first memory region different than the first remedial action.

18. The non-transitory computer-readable storage medium of claim 17, wherein the cost function corresponds to an energy expenditure of the error correction operation, a duration of the error correction operation, or a combination thereof.

19. The non-transitory computer-readable storage medium of claim 17, wherein the error correction operation comprises an ordered list of error correction steps, and wherein performing the error correction operation includes performing the error correction steps in order until either the error correction operation is successful or the ordered list of error correction steps is complete.

20. The non-transitory computer-readable storage medium of claim 19, wherein whether the first memory region has exceeded the first predetermined threshold or the second predetermined threshold is based at least in part on (i) which one of the error correction steps in the ordered list corrected the bit error and (ii) on a depth of the one of the error correction steps from a start of the ordered list.

* * * * *